US011486932B2

(12) United States Patent
Delaille

(10) Patent No.: US 11,486,932 B2
(45) Date of Patent: Nov. 1, 2022

(54) METHOD FOR MANAGING A STATE OF CHARGE OF A BATTERY LEFT TO REST

(71) Applicant: COMMISSARIAT A L'ENERGIE ATOMIQUE ET AUX ENERGIES ALTERNATIVES, Paris (FR)

(72) Inventor: Arnaud Delaille, Bassens (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 178 days.

(21) Appl. No.: 16/955,550

(22) PCT Filed: Dec. 18, 2018

(86) PCT No.: PCT/EP2018/085614
§ 371 (c)(1),
(2) Date: Jun. 18, 2020

(87) PCT Pub. No.: WO2019/121756
PCT Pub. Date: Jun. 27, 2019

(65) Prior Publication Data
US 2021/0080505 A1 Mar. 18, 2021

(30) Foreign Application Priority Data

Dec. 20, 2017 (FR) .................... 1762616

(51) Int. Cl.
G01R 31/382 (2019.01)
G01R 31/36 (2020.01)
G01R 31/374 (2019.01)
H01M 10/44 (2006.01)

(52) U.S. Cl.
CPC ....... *G01R 31/382* (2019.01); *G01R 31/3646* (2019.01); *G01R 31/3648* (2013.01); *G01R 31/374* (2019.01); *H01M 10/44* (2013.01)

(58) Field of Classification Search
CPC  G01R 31/382; G01R 31/3646; G01R 31/374; G01R 31/3648; H01M 10/44; H02J 7/0047
USPC ........................................ 324/426
See application file for complete search history.

(56) References Cited

U.S. PATENT DOCUMENTS

| 6,664,764 | B1 | 12/2003 | Odaohhara | |
| 10,416,236 | B2* | 9/2019 | Uchino | G01R 31/392 |
| 2004/0066171 | A1 | 4/2004 | Mori | |
| 2016/0266979 | A1* | 9/2016 | Glover | G06F 11/3058 |

OTHER PUBLICATIONS

International Search Report as issued in International Patent Application No. PCT/EP2018/085614, dated Feb. 21, 2019.

* cited by examiner

Primary Examiner — Nathaniel R Pelton
(74) Attorney, Agent, or Firm — Pillsbury Winthrop Shaw Pittman LLP

(57) ABSTRACT

A method for managing a charge state of a battery left to rest and experiencing losses of capacity over time, includes the following stages repeated at regular time intervals: determining the losses of capacity experienced by the battery during a time interval; determining a target value of the charge state; on the basis of the losses of capacity experienced by the battery, a predetermined minimum charge quantity and a maximum discharge capacity of the battery, the target value of the charge state being strictly less than 100%; and adjusting the charge state of the battery to the target value.

11 Claims, 1 Drawing Sheet

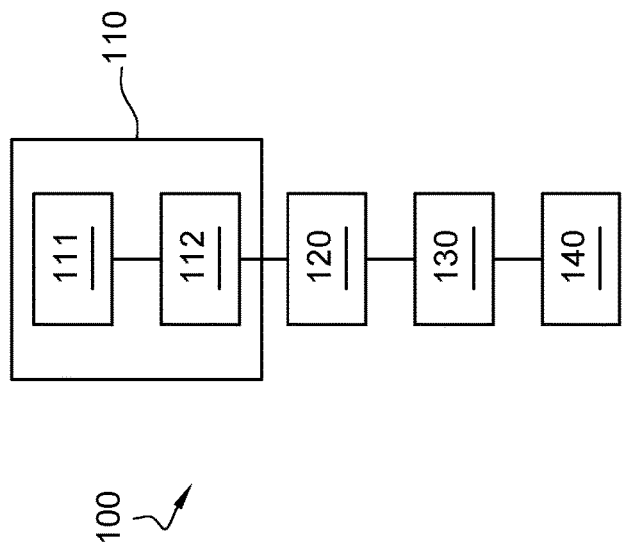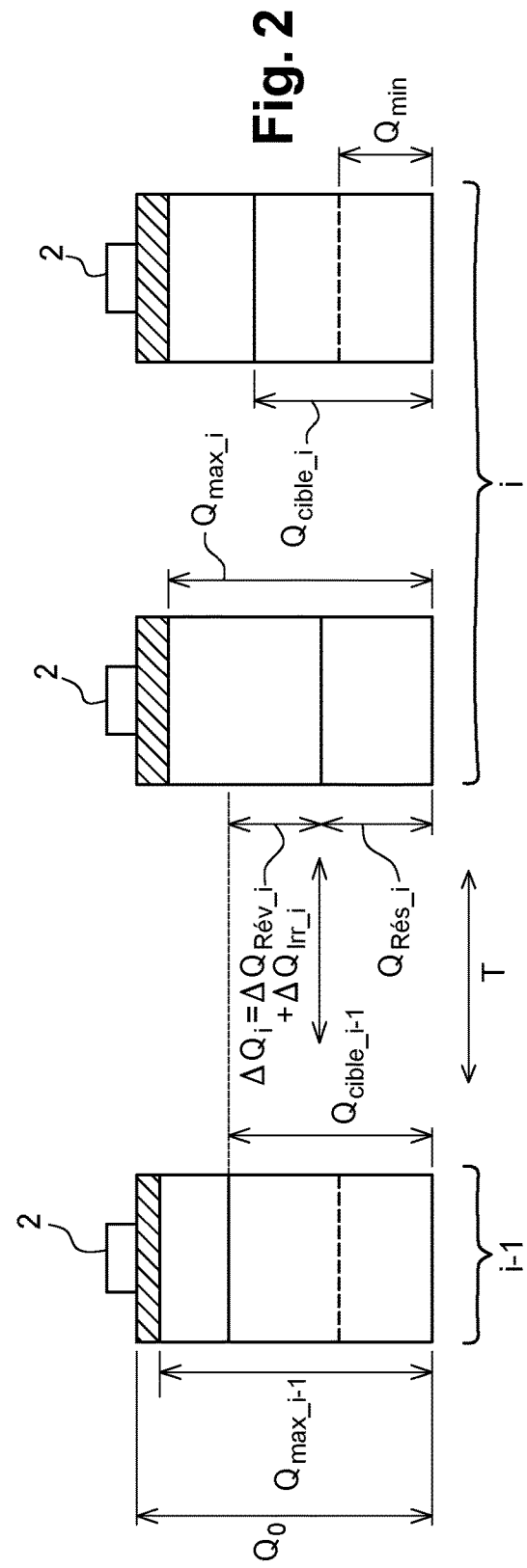

METHOD FOR MANAGING A STATE OF CHARGE OF A BATTERY LEFT TO REST

CROSS-REFERENCE TO RELATED APPLICATIONS

This application is the U.S. National Stage of PCT/EP2018/085614, filed Dec. 18, 2018, which in turn claims priority to French patent application number 1762616 filed Dec. 20, 2017. The content of these applications are incorporated herein by reference in their entireties.

TECHNICAL FIELD OF THE INVENTION

The present invention relates to a method for managing a state of charge of a battery left to rest.

TECHNOLOGICAL BACKGROUND OF THE INVENTION

An uninterruptable power supply, also called UPS, is a device that has the function of supplying an electrical energy to a charge when the main power supply of this charge is faulty. Such a device procures protection against power failures by supplying electrical energy stored for example in a rechargeable battery.

In this type of application, the battery has a "non-cycled" operation, that is to say that is it neither charged nor discharged for extended periods. The battery is left to rest. However, in the event of a power failure, the battery is supposed to take over for a certain time.

The battery is generally maintained at full charge. Yet, it is known that this way of operating has the consequence of causing premature ageing and thus a loss of capacity of the battery. It is thus often necessary to have to replace the battery so that the device is always capable of ensuring its role.

Besides, the document US2004/0066171 A1 describes a method for adjusting the state of charge of a battery equipping a mobile device such as a mobile telephone, a portable computer or a digital camera, as a function of the schedule of the user of the device. In particular, the battery is completely charged when a high level of autonomy is foreseen. Conversely, the battery is placed in a lower state of charge when it is foreseen to connect the device to an external power supply source.

SUMMARY OF THE INVENTION

It is clear from the foregoing that there exists a need to have a method making it possible to optimise the charge of a battery so that it can fulfil the function that is assigned to it while limiting its ageing.

The present invention aims to respond to this need by proposing a method for managing a state of charge of a battery left to rest and suffering capacity losses over time, the management method comprising the following steps repeated at regular time intervals:
 determining the capacity losses suffered by the battery during a time interval;
 determining a target value of the state of charge from the capacity losses suffered by the battery, a predetermined minimum amount of charge and a maximum discharge capacity of the battery, the target value of the state of charge being strictly less than 100%;
 adjusting the state of charge of the battery to the target value.

Thanks to the method of the invention, the battery has a charge level which allows the battery both to execute a certain function for a predetermined duration and to extend its lifetime while not being maintained at full charge.

The management method according to the invention may also comprise one or more characteristics among the following considered individually or according to all technically possible combinations thereof.

According to an embodiment, the capacity losses suffered by the battery are determined from a preceding target value of the state of charge and an amount of residual charge present in the battery.

According to an embodiment, the step of determining the capacity losses suffered by the battery comprises the following sub-steps:
 determining irreversible capacity losses from a current value of the maximum discharge capacity and a preceding value of the maximum discharge capacity; and
 determining reversible capacity losses from the preceding target value of the state of charge, the amount of residual charge present in the battery and the irreversible capacity losses.

According to an embodiment, the amount of residual charge present in the battery is measured during a first operation of a capacity test and in that the maximum discharge capacity of the battery is measured during a second operation of the capacity test.

According to an embodiment, the capacity test successively comprises a first complete discharge phase of the battery, a complete charge phase of the battery and a second complete discharge phase of the battery, the amount of residual charge present in the battery being measured during the first complete discharge phase of the battery and the maximum discharge capacity of the battery being measured during the second complete discharge phase of the battery.

According to an alternative embodiment, the battery has a faradaic efficiency reaching substantially 100% and in that the capacity test successively comprises a complete discharge phase of the battery and a complete charge phase of the battery, the amount of residual charge present in the battery being measured during the complete discharge phase of the battery and the maximum discharge capacity of the battery being measured during the complete charge phase of the battery.

According to an embodiment, the management method further comprises a step consisting in verifying if the battery has a maximum discharge capacity greater than or equal to a target amount of charge corresponding to the target value of the state of charge.

According to an embodiment, the target value of the state of charge is equal to the sum of the capacity losses suffered by the battery and the predetermined minimum amount of charge, divided by the maximum discharge capacity of the battery.

According to an embodiment, the capacity losses comprise reversible losses of which a first part is due to a consumption current delivered by the battery, the first part of the reversible losses being compensated between two successive steps of adjustment of the state of charge.

According to an embodiment, the compensation of the first part of the reversible losses is taken into account during the step of determining the capacity losses.

According to an embodiment, the management method further comprises a step of measuring an operating temperature of the battery, an instantaneous discharge capacity of the battery being determined as a function of the operating temperature of the battery.

According to an embodiment, the target value of the state of charge is modified as a function of the instantaneous discharge capacity.

BRIEF DESCRIPTION OF THE FIGURES

The invention and the different applications thereof will be better understood on reading the description that follows and by examining the figures that accompany it, among which:

FIG. 1 is a functional representation of a method for managing a state of charge of a battery, according to an embodiment of the invention;

FIG. 2 schematically represents the state of the battery in the course of different steps of the method of FIG. 1.

The figures are only presented for illustrative purposes and in no way limit the invention.

For greater clarity, identical or similar elements are marked by identical reference signs in all of the figures.

DETAILED DESCRIPTION OF EMBODIMENTS OF THE INVENTION

A battery is a device for storing electrical energy which may be notably characterised by two parameters, namely a state of health, also called SOH, and a state of charge, also called SOC.

The state of health is expressed in percentage and corresponds to the ratio between the maximum discharge capacity $Q_{max}$ and the nominal capacity $Q_0$ of the battery. The maximum discharge capacity $Q_{max}$ represents the amount of charge that the battery can supply when it is completely charged. The nominal capacity $Q_0$ is the initial maximum discharge capacity of the battery, that is to say when the battery is new. The closer the maximum discharge capacity is to the nominal capacity, the better the state of health of the battery.

The state of charge is expressed in percentage and corresponds to the ratio between the amount of charge $Q(t)$ stored in the battery at a given instant t and the maximum discharge capacity $Q_{max}$ of the battery (at this instant).

An embodiment of a method for managing 100 the state of charge of a battery 2 according to the invention will now be described with reference to FIGS. 1 and 2.

In the context of the invention, the battery 2 is left to rest for an extended period of time, in particular in a non-zero state of charge. In other words, during this period, the battery 2 is not used to supply electrical energy. However, the battery 2 is intended to deliver a predetermined amount of electrical energy to enable an electrical device to execute a function for a certain time. For example, the electrical device equipped with the battery may be an uninterruptable power supply, also called UPS, consisting in delivering power in the event of failure of the main power supply system. Another example is that of a battery of a self-contained emergency lighting unit (SELU), consisting in supplying a lighting system in the event of power failure to indicate an emergency exit. It is also possible to cite as an example, still non-limiting, the case of a battery of an electric bike or instead a power tool, unused sometimes for extended periods, but which can be conserved advantageously at a non-zero state of charge to provide a back-up in the event of immediate need.

"Extended duration" is taken to mean a duration in the course of which the battery 2 suffers capacity losses which may be quantified, the capacity losses being for example greater than 1% of the state of charge of the battery 2. It should be noted that the capacity losses depend on the storage conditions of the battery 2, and in particular the temperature, the state of charge and the state of health of the battery 2.

Depending on the type of application, the battery 2 may be a lithium-ion (Li-ion) battery, a nickel-metal hydride (NiMH) battery, a lead battery, a sodium-ion battery, a sodium-nickel chloride battery, or any other suitable battery.

The management method 100 comprises a first step 110 of determining the capacity losses $\Delta Q_i$ suffered by the battery 2, a second step 120 of determining a target value $SOC_{cible\_i}$ of the state of charge of the battery 2, notably as a function of the capacity losses $\Delta Q_i$ suffered by the battery 2, and a third step 130 of adjusting the state of charge of the battery 2 to the target value $SOC_{cible\_i}$. The target value $SOC_{cible\_i}$ of the state of charge is strictly less than 100%.

Steps 110, 120 and 130 of the management method 100 are repeated at regular intervals, in other words periodically. Thus, thanks to the invention, the charge of the battery 2 is regularly placed to a sufficient level to make it possible to execute the function of the electrical device for a predetermined duration, this level being however lower than the full charge level (SOC=100%). The battery 2 is thus not maintained permanently at its full charge, which extends its lifetime.

To give an order of idea of the period T of repetition of steps 110, 120 and 130 of the management method 100, that is to say the time period between two successive iterations of steps 110, 120 and 130, it may be cited the example of self-contained emergency lighting units (SELU) for which the state of the batteries is verified around every three months. It is clearly understood that this value of T=3 months is given for indicative purposes and that the period T with which the steps 110, 120 and 130 are repeated may take any value adapted to the context of implementation of the invention.

The capacity losses may be classed into two categories, namely irreversible losses and reversible losses.

Irreversible capacity losses correspond to a reduction in the maximum discharge capacity of the battery 2. In other words, they are definitive autonomy losses which cannot be recovered by recharging the battery 2. Irreversible losses are due to ageing of the battery 2 and they may be monitored through the parameter of state of health of the battery 2.

Conversely, reversible capacity losses correspond to a reduction in the amount of charge stored in the battery 2. Reversible losses may thus be recovered by recharging the battery 2. Reversible losses may be monitored through the parameter of state of charge of the battery 2. Reversible losses comprise a first part called "self-discharge" and a second part corresponding to a consumption drawn from the battery 2.

Self-discharge is due to parasitic electrochemical reactions which lead to a reduction in the state of charge of the battery 2, even when the latter is not drawn upon. Self-discharge may also be caused by a transfer of electrons from one electrode to the other due to manufacturing defects and/or to the electronic conductivity of the electrolyte.

The self-discharge value depends on the state of charge and the temperature of the battery 2. As an example, the state of charge of a lithium-ion battery at a temperature of 30° C. decreases by around 4%, respectively 8%, per month when the initial state of charge is of the order of 30% to 40%, respectively 100%. When the temperature of the lithium-ion battery is 45° C., the reduction in the state of charge passes to around 8%, respectively 25%, for an initial state of charge of the order of 30% to 40%, respectively 100%

The consumption drawn from the battery 2 may be due to a leakage current, to a current supplying a device for electronically managing the battery 2, also called Battery Management System (BMS), and/or to a current used within the context of thermal management of the battery 2. Thermal management consists in cooling or heating the battery with the aim of limiting the ageing thereof.

The (total) capacity losses $\Delta Q_i$ are equal to the sum of the reversible capacity losses $\Delta Q_{Rév\_i}$ and the irreversible capacity losses $\Delta Q_{Irr\_i}$ suffered by the battery 2 during the last elapsed time period T, in other words from the last iteration of steps 110 to 130 or from the start (i.e. the first commissioning of the battery) when it involves the first iteration of steps 110 to 130:

$$\Delta Q_i = \Delta Q_{Irr\_i} + \Delta Q_{Rév\_i}$$

where i is a strictly positive whole number designating the iteration underway.

The (total) capacity losses $\Delta Q_i$ may be calculated using the following equation:

$$\Delta Q_i = Q_{cible_{i-1}} - Q_{Rés\_i}$$

where $Q_{Rés\_i}$ is the amount of residual charge stored in the battery 2 at the start of step 110 of index i and $Q_{cible\_i-1}$ is the target amount of charge corresponding to the target value $SOC_{cible\_i-1}$ of state of charge defined during the last levelling of the state of charge, that is to say during the preceding iteration i–1 of steps 110 to 130. For the first iteration of steps 110 to 130 (i=1), the target amount of charge $Q_{cible\_0}$ is for example chosen equal to 110% of the minimum amount of charge necessary for the operation of the electrical device for a predetermined duration and called hereafter $Q_{min}$ ($Q_{cible\_0}=1.1*Q_{min}$).

In a preferential embodiment of the management method 100, it is sought to distinguish reversible capacity losses from irreversible capacity losses of the battery 2. The first step 110 of the management method 100 then comprises a first sub-step 111 of determining the irreversible capacity losses $\Delta Q_{Irr\_i}$ suffered by the battery 2 during the last elapsed time period T.

The irreversible capacity losses $\Delta Q_{Irr\_i}$ suffered by the battery 2 between step 110 of index i–1 and step 110 of index i may be calculated using the following equation:

$$\Delta Q_{Irr\_i} = Q_{max\_i-1} - Q_{max\_i}$$

where $Q_{max\_i-1}$ is the maximum discharge capacity of the battery 2 during step 110 of index i–1 and $Q_{max\_i}$ is the maximum discharge capacity of the battery 2 during step 110 of index i. During the first iteration of steps 110 to 130 (i=1), the maximum discharge capacity $Q_{max\_0}$ of the battery 2 is equal to the nominal capacity $Q_0$ of the battery.

In this same preferential embodiment, the first step 110 of the management method 100 comprises a second sub-step 112 of determining the reversible capacity losses $\Delta Q_{Rév\_i}$ suffered by the battery 2 in during the last elapsed time period T.

The reversible capacity losses $\Delta Q_{Rév\_i}$ suffered by the battery 2 between step 110 of index i–1 and step 110 of index i may be calculated using the following equation:

$$\Delta Q_{Rév\_i} = Q_{cible_{i-1}} - Q_{Rés\_i} - \Delta Q_{Irr\_i}$$

The amount of residual charge $Q_{Rés\_i}$ is preferably measured during a first operation of a capacity test. This capacity test comprises for example a first complete discharge phase, followed by a complete charge phase and a second complete discharge phase. The amount of residual charge $Q_{Rés\_i}$ is for example measured by integrating the current supplied by the battery 2 during the first complete discharge phase of the capacity test.

The maximum discharge capacity $Q_{max\_i}$ is preferably measured during a second operation of the capacity test, for example by integrating the current supplied by the battery 2 in the course of the second complete discharge phase.

According to another embodiment, when the battery 2 has a faradaic efficiency substantially equal to 100%, the maximum discharge capacity $Q_{max\_i}$ of the battery 2 may be measured directly during the complete charge phase that follows the first complete discharge phase making it possible to measure the amount of residual charge $Q_{Rés\_i}$. Thus, the measurement of the maximum discharge capacity $Q_{max\_i}$ is carried out more rapidly, which reduces the time during which the battery 2 no longer ensures its functions.

Throughout the description and in the claims, "faradaic efficiency substantially equal to 100%" is taken to mean a faradaic efficiency greater than or equal to 99%. In this case, the amount of charge charged in the battery 2 is considered equivalent to the amount of charge delivered. This is the case for example for lithium-ion batteries.

The target value $SOC_{cible\_i}$ is defined in such a way that the battery 2 comprises at the end of a time period T (i.e. just before a new levelling of the state of charge) an amount of charge greater than or equal to a minimum amount of charge $Q_{min}$ necessary to execute for the desired duration the function of the electrical device associated with the battery 2. The target value $SOC_{cible\_i}$ of the state of charge is determined during step 120 from the maximum discharge capacity $Q_{max\_i}$ of the battery 2, the (total) capacity losses $\Delta Q_i$ determined at step 110 and the minimum amount of charge $Q_{min}$. More particularly, the target value $SOC_{cible\_i}$ of the state of charge is determined from the maximum discharge capacity $Q_{max\_i}$ and the sum of the capacity losses $\Delta Q_i$ and the minimum amount of charge $Q_{min}$.

The target value $SOC_{cible\_i}$ of the state of charge is preferably equal to the sum of the capacity losses $\Delta Q_i$ and the minimum amount of charge $Q_{min}$, divided by the maximum discharge capacity $Q_{max\_i}$:

$$SOC_{cible\_i} = \frac{Q_{cible\_i}}{Q_{max\_i}} = \frac{Q_{min} + \Delta Q_i}{Q_{max\_i}}$$

In an alternative embodiment, the target amount of charge $Q_{cible}$ is defined as greater than the sum of the capacity losses $\Delta Q_i$ and the minimum amount of charge $Q_{min}$. In other words, it is provided a safety margin M during the calculation of the target amount of charge $Q_{cible}$. It is thus possible to ensure that the battery 2 is still able to fulfil its role. The target amount of charge $Q_{cible}$ is for example comprised between 110% and 150% of the sum of the minimum amount of charge $Q_{min}$ and the capacity losses $\Delta Q_i$.

$$SOC_{cible\_i} = \frac{Q_{cible\_i}}{Q_{max\_i}} = \frac{M \times (Q_{min} + \Delta Q_i)}{Q_{max}}$$

with M a margin coefficient comprised between 110% and 150%.

The minimum amount of charge $Q_{min}$ is preferably constant from one iteration to the other of steps 110 to 130 of the management method 100.

The management method 100 is thus based on the hypothesis that the losses (reversible and irreversible) suffered by the battery 2 during the time interval T situated between the iterations i and i+1 of steps 110 to 130 will be less than or equal to the losses suffered by the battery 2 during the time interval T situated between the iterations i−1 and i of steps 110 to 130.

Since capacity losses have a tendency to decrease over time, the target amount of charge $Q_{cible\_i}$ progressively comes closer to the minimum amount of charge $Q_{min}$, which further improves the lifetime of the battery.

The adjustment of the state of charge of the battery 2 to the target value $SOC_{cible\_i}$ (third step 130 of the management method 100) is carried out either by charging the battery 2, when the capacity test ends by a complete discharge phase, or by discharging the battery 2, when the capacity test ends by a complete charge phase. The charge or discharge is carried out until reaching the target amount of charge $Q_{cible\_i}$ corresponding to the target value $SOC_{cible\_i}$ of the state of charge, and preferably at constant current. The amount charged ($Q_{cible\_i}$), respectively discharged ($Q_{max\_i}-Q_{cible\_i}$), is measured by integrating the charge current, respectively discharge current.

Advantageously, the management method 100 comprises a fourth step 140 of verification of the aptitude of the battery 2 to store the target amount of charge $Q_{cible\_i}$. In other words, it is verified if the maximum discharge capacity $Q_{max\_i}$, which is equal to the nominal capacity $Q_0$ of the battery 2 less all of the irreversible capacity losses (i.e. from the start), is greater than or equal to the target amount of charge $Q_{cible\_i}$. If this is not the case, the battery 2 needs to be replaced. This step is equivalent to monitoring the state of health $SOH_i$ of the battery 2 which may be defined by the following equation:

$$SOH_i = \frac{Q_{max\_i}}{Q_0}$$

This fourth step 140 of verification is preferably accomplished between the second step 120 (determination of $SOC_{cible\_i}$) and the third step 130 (levelling of the state of charge) of the management method 100. Advantageously, this fourth step 140 of verification is also carried out periodically, preferably with the same period T as the first, second and third steps 110, 120, 130 of the management method 100.

As described previously, capacity losses comprise a part linked to a consumption current supplied by the battery 2. When the battery 2 is not thermally managed, the consumption current may be considered as constant. In this case, the part $\Delta Q_{Rév\_conso}$ of the capacity losses linked to this consumption current $I_{conso}$ has a linear behaviour over time t and may be defined by the following equation:

$$\Delta Q_{Rév\_conso} = I_{conso} \cdot t$$

Advantageously, the capacity losses $\Delta Q_{Rév\_conso}$ due to consumption may be compensated between two successive steps 130 of adjustment of the state of charge. Thus, it is possible to reduce the value of the target amount of charge $Q_{cible}$ so that it comes close to the value of the minimum amount of charge $Q_{min}$ that the battery 2 must store. This makes it possible to further optimise the management of the state of charge of the battery 2.

In practice, the capacity losses $\Delta Q_{Rév\_conso}$ linked to consumption are generally relatively low, the consumption current $I_{conso}$ being of the order of a micro-ampere. It may thus be difficult to compensate these capacity losses by means of a constant charge current which should be substantially equal to the consumption current $I_{conso}$. In this case, the compensation of such losses may be carried out on an ad hoc basis and in several stages between two successive steps 130 of adjustment of the state of charge. The charge current is then higher and thus easier to supply to the battery 2.

Advantageously, the modifications of the state of charge of the battery 2 that have taken place between steps 130 of adjusting the state of charge to the target value $SOC_{cible\_i}$ are integrated gradually in such a way as not to alter the calculation of the capacity losses.

According to an alternative embodiment, the operating temperature of the battery 2, when it is at rest, is measured. It is thus possible to determine the instantaneous capacity of the battery 2, for example from abacuses giving the capacity of the battery 2 as a function of the discharge current and temperature. The target value $SOC_{cible\_i}$ of the state of charge may then be modified as a function of the value of this instantaneous capacity so that the function of the battery 2 is always ensured. As an example, this consists in recharging the battery 2 when the operating temperature decreases and in discharging the battery when the operating temperature increases.

Naturally, the invention is not limited to the embodiments described with reference to the figures and alternatives could be envisaged without going beyond the scope of the invention.

The invention claimed is:

1. A management method for managing a state of charge of a battery left to rest and suffering capacity losses over time, the management method comprising the following steps repeated at regular time intervals:
   determining the capacity losses suffered by the battery during a time interval;
   determining a target value of the state of charge, the target value of the state of charge being equal to a target amount of charge divided by a maximum discharge capacity of the battery, the target amount of charge being greater than or equal to a sum of capacity losses suffered by the battery and a minimum amount of charge necessary to execute, for a desired duration, a function of an electrical device associated with the battery, the target value of the state of charge being strictly less than 100%;
   adjusting the state of charge of the battery to the target value.

2. The management method according to claim 1, wherein the capacity losses suffered by the battery are determined from a preceding target value of the state of charge and an amount of residual charge present in the battery.

3. The management method according to claim 2, wherein the step of determining the capacity losses suffered by the battery comprises the following sub-steps:
   determining irreversible capacity losses from a current value of the maximum discharge capacity and a preceding value of the maximum discharge capacity; and
   determining reversible capacity losses from the preceding target value of the state of charge, the amount of residual charge present in the battery and the irreversible capacity losses.

4. The management method according to claim 2, wherein the amount of residual charge present in the battery is measured during a first operation of a capacity test and wherein the maximum discharge capacity of the battery is measured during a second operation of the capacity test.

5. The management method according to claim 4, wherein the capacity test successively comprises a first complete discharge phase of the battery, a complete charge phase of the battery and a second complete discharge phase of the battery, the amount of residual charge present in the battery being measured during the first complete discharge phase of the battery and the maximum discharge capacity of the battery being measured during the second complete discharge phase of the battery.

6. The management method according to claim 4, wherein the battery has a faradaic efficiency reaching substantially 100% and wherein the capacity test successively comprises a complete discharge phase of the battery and a complete charge phase of the battery, the amount of residual charge present in the battery being measured during the phase of complete discharge of the battery and the maximum discharge capacity of the battery being measured during the complete charge phase of the battery.

7. The management method according to claim 1, further comprising a step consisting in verifying if the battery has a maximum discharge capacity greater than or equal to the target amount of charge corresponding to the target value of the state of charge.

8. The management method according to claim 1, wherein the capacity losses suffered by the battery comprise reversible losses of which a first part is due to a consumption current delivered by the battery, the first part of the reversible losses being compensated between two successive steps of adjustment of the state of charge.

9. The management method according to claim 8, wherein the compensation of the first part of the reversible losses is taken into account during the step of determining the capacity losses.

10. The management method according to claim 1, further comprising a step of measuring an operating temperature of the battery, an instantaneous discharge capacity of the battery being determined as a function of the operating temperature of the battery.

11. The management method according to claim 10, wherein the target value of the state of charge is modified as a function of the instantaneous discharge capacity.

* * * * *